(12) United States Patent
Drake et al.

(10) Patent No.: US 11,892,504 B1
(45) Date of Patent: Feb. 6, 2024

(54) METHOD AND SYSTEM FOR DEBUGGING METASTABILITY IN DIGITAL CIRCUITS

(71) Applicant: Cadence Design Systems, Inc., San Jose, CA (US)

(72) Inventors: Alberto Arias Drake, Seville (ES); Bijitendra Mittra, West Bengal (IN); Keyliane da Silva Fernandes Silvano, Belo Horizonte (BR)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 17/950,983

(22) Filed: Sep. 22, 2022

(51) Int. Cl.
*G01R 31/00* (2006.01)
*G01R 31/317* (2006.01)

(52) U.S. Cl.
CPC . *G01R 31/31704* (2013.01); *G01R 31/31727* (2013.01)

(58) Field of Classification Search
CPC ............... G01R 31/31704; G01R 31/31727
See application file for complete search history.

(56) References Cited

U.S. PATENT DOCUMENTS

| | | | |
|---|---|---|---|
| 8,806,401 B1 * | 8/2014 | Sarwary | G06F 30/3323 714/33 |
| 2014/0282321 A1 * | 9/2014 | Sarwary | G06F 30/3323 716/108 |
| 2021/0350053 A1 * | 11/2021 | Ahuja | G06F 30/327 |

* cited by examiner

*Primary Examiner* — Christine T. Tu
(74) *Attorney, Agent, or Firm* — Foley & Lardner LLP

(57) ABSTRACT

Systems and methods of debugging a design under test for metastability issues using formal verification. In one aspect, the method includes determining, by a server, that a functionality of the DUT failed an assertion; generating, by the server, a plurality of first waveforms for a plurality of clock domain crossing (CDC) pairs that are in a cone of influence of the assertion; applying, by the server, a constraint including a condition to the plurality of waveforms; and generating, by the server, one or more second waveforms for a first subset of the plurality of CDC pairs, wherein the first subset of the CDC pairs satisfied the condition.

20 Claims, 9 Drawing Sheets

METHOD AND SYSTEM FOR DEBUGGING METASTABILITY IN DIGITAL CIRCUITS

TECHNICAL FIELD

The present implementations relate generally to verification systems, and more particularly to debugging metastability issues using verification systems.

BACKGROUND

Modern semiconductor based integrated circuits (ICs) are increasingly complex and contain millions of circuit devices, such as transistors, and millions of interconnections between the circuit devices. Designing such complex circuits cannot be accomplished manually, and circuit designers use computer based Electronic Design Automation (EDA) tools for synthesis, debugging, and functional verification of the ICs.

Metastability is an issue in digital electronics where certain requirements are not met for a data signal to be accurately stored in a flip-flop. Generally the voltage of a signal input to the flip-flop has to remain stable before and after a clock edge in order to meet the metastability requirements. Otherwise, the flip-flop enters a metastable state which can result in incorrect and/or unpredictable signal values being stored and output from the flip-flop, causing functional errors in the system. Traditional methods of debugging metastability issues are not comprehensive or very inefficient.

SUMMARY

What is therefore desired is a system and method for debugging metastability issues in digital circuits efficiently. Embodiments of the present disclosure include the use of injection modeling of various clock domain crossing (CDC) pairs that are in the cone of influence (COI) of a user assertion. The user is able to provide one simple command or input that can remove all of the CDC pairs in the COI of the assertion that do not contribute to the metastability related failure and not have to go through a repetitive process of enabling and disabling CDC pairs to find the culprit CDC pair that is causing the metastability issues.

One aspect of the disclosure includes a method for debugging a design under test (DUT) using formal verification. The method includes determining, by a server, that a functionality of the DUT failed an assertion; generating, by the server, a plurality of first waveforms for a plurality of CDC pairs that are in a COI of the assertion; and applying, by the server, a constraint to the plurality of waveforms. The constraint includes a condition, and the method further includes generating, by the server, one or more second waveforms for a first subset of the plurality of CDC pairs, wherein the first subset of the CDC pairs satisfied the condition.

The method may further include injecting, by the server, a metastability effect at an output of a destination register of the CDC pair by randomly setting the output to include a previous value in a first setting and a new value in a second setting, and based on the set output, determining, by the server, whether the metastability at the output of the destination register affected the functionality of the DUT.

The method may further include storing, by the server in a memory, an indicator of the destination register of the first subset of CDC pairs, and discarding, by the server, an indicator of the destination register of the plurality of CDC pairs that are not included in the first subset of CDC pairs.

A waveform of the plurality of first waveforms and the one or more second waveforms may include a waveform for a signal that indicates whether or not an injection occurred.

The determination of whether the metastability affected the functionality of the DUT may comprise comparing, by the server, an expected output of the destination register to a calculated output of the register that was injected with metastability, and based on the comparison, determining, by the server, that the expected output is not the same as the calculated output.

The COI may include one or more signals of the CDC pair and one or more drivers that affect the one or more signals.

The method may further include identifying, by the server, a second subset of the CDC pairs that did not satisfy the condition.

The method may further include receiving, by the server, a user input including a command to apply the constraint to remove CDC pairs that do not affect the assertion.

Another aspect of the present disclosure includes a system for debugging a DUT using formal verification. The system includes one or more processor having instructions stored thereon that, when executed by the one or more processors, causes the one or more processors to determine that a functionality of the DUT failed an assertion, generate a plurality of first waveforms for a plurality of CDC pairs that are in a COI of the assertion, one or more of the plurality of CDC pairs causing metastability, apply a constraint including a condition to the plurality of waveforms, and generate one or more second waveforms for a first subset of the plurality of CDC pairs, the first subset of the CDC pairs satisfying the condition.

The instructions may further cause the one or more processors to inject a metastability effect at an output of a destination register of the CDC pair by randomly setting the output to include a previous in a first setting and a new value in a second setting, and based on the set output, determine whether the metastability at the output of the destination register affected the functionality of the DUT.

The instructions may further cause the one or more processors to store an indicator of the destination register of the first subset of CDC pairs and discard an indicator of the destination register of the plurality of CDC pairs that are not included in the first subset of CDC pairs.

A waveform of the plurality of first waveforms and the one or more second waveforms may include a waveform for a signal that indicates whether or not metastability occurred.

The instructions may further cause the one or more processors to compare an expected output of the destination register to a calculated output of the register that was injected with metastability and based on the comparison, determine that the expected output is not the same as the calculated output.

The COI may include one or more signals of the CDC pair and one or more drivers that affect the one or more signals.

The instructions may further cause the one or more processors to identify a second subset of the CDC pairs that did not satisfy the condition.

The instructions may further cause the one or more processors to receive a user input including a command to apply the constraint to remove CDC pairs that do not affect the assertion.

Another aspect of the present disclosure includes a non-transitory computer readable medium including one or more instructions stored thereon and executable by a processor to determine that a functionality of the DUT failed an assertion, inject a metastability effect to a plurality of CDC pairs that are in a COI of the assertion; generate a plurality of first waveforms for the plurality of CDC pairs, apply a constraint to the plurality of waveforms, wherein the constraint includes a condition, and remove a subset of the first waveforms of the plurality of CDC pairs that did not satisfy the condition.

The injection of the metastability effect may include injecting the metastability effect at an output of a destination register of the CDC pair by randomly setting the output to include a previous value in a first setting and a new value in a second setting.

The instructions may further cause the processor to inject a metastability effect at an output of a destination register of the CDC pair by randomly setting the output to include a previous value in a first setting and a new value in a second setting, and based on the set output, determine whether the metastability at the output of the destination register affected the functionality of the DUT.

The instructions may further cause the processor to compare an expected output of the destination register to a calculated output of the register that was injected with metastability, and based on the comparison, determine that the expected output is not the same as the calculated output.

The instructions may further cause the processor to receive a user input including a command to apply the constraint to remove CDC pairs that do not affect the assertion.

BRIEF DESCRIPTION OF THE DRAWINGS

These and other aspects and features of the present implementations will become apparent to those ordinarily skilled in the art upon review of the following description of specific implementations in conjunction with the accompanying figures, wherein.

DETAILED DESCRIPTION

Figure 1:
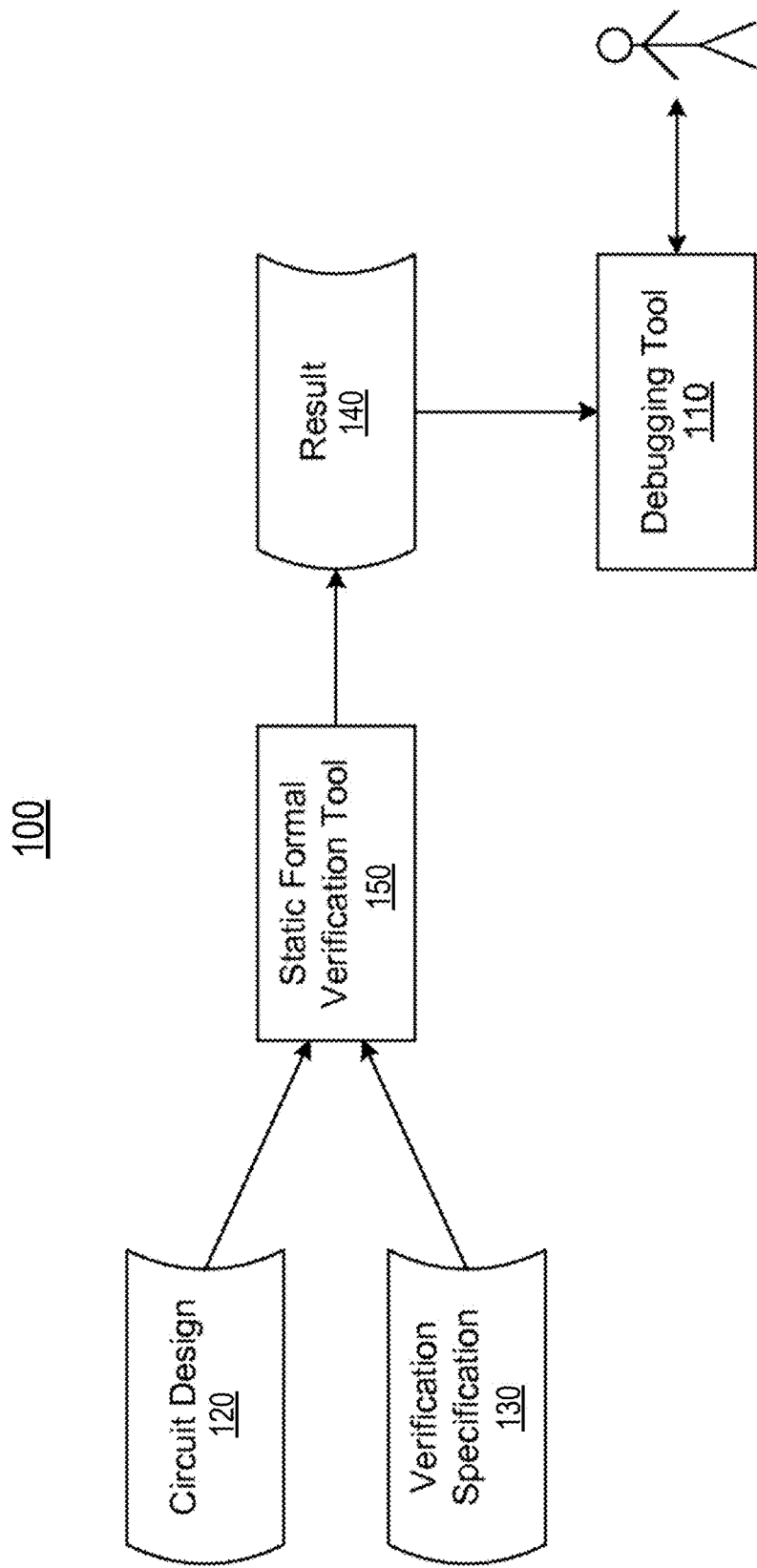
FIG. 1 illustrates a process for formal verification of a circuit design, in accordance with some embodiments.

The present implementations will now be described in detail with reference to the drawings, which are provided as illustrative examples of the implementations so as to enable those skilled in the art to practice the implementations and alternatives apparent to those skilled in the art. Notably, the figures and examples below are not meant to limit the scope of the present implementations to a single implementation, but other implementations are possible by way of interchange of some or all of the described or illustrated elements. Moreover, where certain elements of the present implementations can be partially or fully implemented using known components, only those portions of such known components that are necessary for an understanding of the present implementations will be described, and detailed descriptions of other portions of such known components will be omitted so as not to obscure the present implementations. Implementations described as being implemented in software should not be limited thereto, but can include implementations implemented in hardware, or combinations of software and hardware, and vice-versa, as will be apparent to those skilled in the art, unless otherwise specified herein. In the present specification, an implementation showing a singular component should not be considered limiting; rather, the present disclosure is intended to encompass other implementations including a plurality of the same component, and vice-versa, unless explicitly stated otherwise herein. Moreover, applicants do not intend for any term in the specification or claims to be ascribed an uncommon or special meaning unless explicitly set forth as such. Further, the present implementations encompass present and future known equivalents to the known components referred to herein by way of illustration.

Typical methods of debugging metastability issues have limitations that can lead to inefficiencies and/or inaccuracies. For example, one traditional method of debugging metastability issues is to simulate jitter in the clock signals to observe what would happen if the clock edge arrived early, as expected, or delayed. However, this method cannot be used to debug all metastability issues and scenarios without being very resource-intensive and time-consuming. In another approach, a randomizable synchronizer model may randomly generate expected or delayed outputs. However, this method can only catch setup violations but not hold violations. Furthermore, circuits that do not use synchronizers (e.g., unsynchronized) cannot be debugged for metastability issues using this method.

Formal verification has risen in popularity to debug systems. Formal verification typically uses mathematical models to prove or disprove correctness of the intended design by using assertions. Assertions are statements or expressions that, if false, indicates an error or bug. In hardware design, an assertion is a conditional statement that checks for specific behavior and displays a message if it occurs. When the conditional statement is not satisfied, the scenario or situation in which the scenario occurs is called a counterexample.

A CDC pair may be defined as a pair of registers and/or signals that are input and output of the pair of registers that are in a CDC path. Even when using formal verification, however, debugging metastability can be time-consuming and challenging, especially when there are multiple CDC pairs that can potentially raise metastability issues. Typically a user needs to disable one CDC pair at a time to determine whether the metastability issue arose from that CDC pair. If the turned-off CDC pair is not the culprit, the user proceeds to proving another CDC pair by turning off a different CDC pair. Sometimes the culprit CDC pair can be found but other times there may be multiple CDC pairs that can cause the metastability issues. This iterative and repetitive process can be challenging and time-consuming. Accordingly, there is a need for a more efficient method of debugging metastability issues.

Embodiments of the present disclosure provide methods and systems of debugging metastability issues in a design using formal verification. Injection modeling is used to inject metastability effect into a signal to determine when metastability may cause a variance in the functionality of the design. Waveforms of the multiple CDC pairs that may have contributed to the failure of the assertion may be generated and displayed. A soft constraint may then be applied to the CDC pairs to determine whether or not each of the CDC pairs actually caused the failed assertion. The CDC pairs that did not affect the failed assertion may be removed, and the waveforms may be generated again. Embodiments provided advantages of identifying problematic CDC pairs quickly, significantly reducing verification times.

FIG. 1 illustrates a process 100 for formal verification of a circuit design 120, in accordance with some embodiments. The process 100 may be performed by a metastability debugging server which may include a static formal verification tool 150 and a debugging tool 110. A circuit design 120 may be embodied in a data file encoded using a hardware description language (HDL), which may describe the structural design and operation of a circuit. A set of requirements may be derived from a design specification for the circuit and then used to test whether the circuit design is compliant with the design specification. A user, such as a circuit designer or a verification engineer, may supply the requirements for the circuit design. The requirements may be encoded in a verification specification 130 as one or more properties and/or assumptions for the circuit design 120, encoded for example using Property Specification Language (PSL) or SystemVerilog Assertion (SVA). The verification specification 130 may be directly coded by a user or captured in an automated process. A property may be represented in the verification specification 130 as an assertion, where the assertion is satisfied if the property is true for all operating conditions of the circuit design 120. A property may also be represented in the verification specification 130 as a cover, where the cover is satisfied if the property is true for some operating condition of the circuit design 120. An assumption specifies that certain input signals to the circuit design may only take on pre-determined values (e.g., "0" or "1") at certain clock cycles when testing the circuit design against the property.

In a formal verification process, the verification tool 150 receives a circuit design 120 and a verification specification 130 for testing the circuit design 120 against a set of requirements. The circuit design 120 and verification specification 130 may be represented in one or more files containing HDL code, which define a digital design and/or properties that give a functional specification of the design. The verification tool 150 may convert the inputs (e.g., the circuit design 120 and verification specification 130) into an internal representation using one or more data structures, such as a netlist. This conversion may comprise two different conversions: (1) synthesis of the input circuit design 120, and (2) property compilation of the properties in the verification specification 130.

The results of the design synthesis and the property compilation are then combined into a common problem instance that is given as input to a model checker in the verification tool 150. The verification tool 150 then performs formal verification on the circuit design 120 using the statically allocated data structure. For assertions, during the formal verification process, the model checker attempts to determine whether there is a possible behavior of the circuit design 120 where one of the properties in the verification specification 130 are not true, which is called a counterexample for the property. If it is determined that no counterexample exists for a property, the property is said to be proven. The results 140 of the formal verification process may thus comprise an indication of whether one or more of the properties are satisfied, and if not, the counterexample showing a condition under which the property fails. The counterexample may include a sequence of values for signals (input, internal, or output) of the circuit design over a number of clock cycles that satisfy the given assumptions but result in the property failure.

The verification of a cover may proceed in a similar way. In some embodiments, for a cover, the verification tool attempts to determine whether there is a possible behavior of the circuit design that satisfies the cover, which is called a cover trace. This cover trace includes a sequence of values for signals of the circuit design over a number of clock cycles that satisfy the given assumption and satisfy the cover.

The verification tool 150 outputs the result 130 of the verification process, which may be stored in memory, passed along to another software process, or displayed to the user. The result may comprise a counterexample if the circuit design 120 fails to meet the properties encoded in the verification specification or a witness if the design 120 satisfies the properties (e.g., the witness can be a cover trace). A debugging tool 110 may also be included to display the counterexample or witness to a circuit designer in a useful way to the designer. In some embodiments, the debugging tool 110 may accept the circuit design 120, verification specification 130, and result 140 as inputs and may apply one or more soft constraints to the result 140 to create a quieter trace. This can facilitate understanding of what aspect of the HDL code in the circuit design 120 is responsible for the counterexample to the property in question. The debugging tool 110 may include a viewer as well as editing software.

The debugging tool 110 then receives a user input instructing the debugging tool 110 to apply one or more soft constraints. A soft constraint is a preference that the counterexample should satisfy if possible, but does not necessarily need to satisfy. In some embodiments, soft constraints help in debugging a counterexample by suppressing irrelevant aspects of the trace that do not contribute to the violation of the property, thereby simplifying the appearance of the trace when displayed as a waveform. Example soft constraints include a preference for setting the value of all input signals to the circuit design to logic 0 or setting the value of all input signals to logic 1, subject to the condition that changing the value does not affect the property violation. Another type of soft constraint is a preference for reducing the overall activity (e.g., number of signal transitions) of signals in the counterexample regardless of whether the signal values should be set to logic 0 or logic 1, subject to the condition that changing the value does not affect the property violation. Constraints can also be defined to apply to input signals, internal design signals, arbitrary HDL expressions, and temporal SVA expressions.

Soft constraints are in contrast to hard constraints. Soft constraints are conditional preferences that do not necessarily need to be satisfied by the counterexample trace. For example, a constraint of "set signal A to 1 only if property P is still violated" is a soft constraint. By contrast, hard constraints are strict requirements that must satisfied by the counterexample trace. For example, a constraint of "set signal A to 1" has no limitations and is a hard constraint. The circuit design and its assumptions are the primary source of hard constraints because they define strict requirements that cannot be avoided.

In some embodiments, the user input comprises a user input that identifies one or more soft constraints for the debugging tool 110 to apply. For example, the user input may select a specific soft constraint from a list of soft constraints presented to the user. As another example, the user may enter a logical expression that defines a soft constraint, which is then received by the debugging tool 110 as a user input. In another embodiment, the debugging tool 110 is configured to apply a default soft constraint, and the user input triggers the application of the default soft constraint.

The debugging tool 110 then applies the soft constraints to the counterexample trace to generate an updated trace. Some soft constraints may be applied to all signals and all clock cycles in the counterexample, whereas other soft constraints may be applied to only a sub-set of the signals, clock cycles, or signal-cycle pairs. In some embodiments, a user marks certain signals or clock cycles as active, which is received by the debugging tool 110 as a user input. The debugging tool 110 may apply the soft constraints only to the portions of the trace marked as active. The active portion of the trace may also be set according to a default configuration (e.g., all cycles active) when there is no user input specifying how the soft constraints should be applied.

In some embodiments, the debugging tool 110 applies the soft constraints to as many signal-cycle pairs as possible within the active portion of the trace. Each signal-cycle pair is considered to be independent of the other signal-cycle pairs. For example, a soft constraint can be satisfied for a signal-cycle pair regardless of whether the soft constraint can be satisfied for another signal-cycle pair on the same signal. For example, if clock cycle 1 of a signal A cannot satisfy a soft constraint, the debugging tool will still attempt to satisfy the soft constraint for clock cycle 2 of signal A. The application of soft constraints effectively removes aspects of the trace that do not contribute to the violation of the property, resulting in a trace that appears "quieter" and is easier to use in debugging the circuit design.

In some embodiments, the debugging tool 110 applies multiple soft constraints to the trace. When multiple soft constraints are involved, the soft constraints are prioritized. Higher priority constraints are generally satisfied at the expense of the lower priority constraints. As such, the debugging tool 110 only satisfies lower priority constraints if it does not result in the violation of a higher priority constraint. The priority for the soft constraints may be set according to a pre-determined configuration or set according to a user input defining the priority order.

After application of the soft constraints, the debugging tool 110 displays a waveform of the updated counterexample trace to a user of the debugging tool 110. In some embodiments, rather than displaying just the updated counterexample trace, the updated counterexample trace is displayed simultaneously with the original counterexample trace. This helps the circuit designer to understand of how the trace has changed as a result of applying the soft constraints. For example, a waveform for the updated counterexample may be displayed side-by-side with or overlaid on top of a waveform for the original counterexample. In another embodiment, a waveform of the updated counterexample is displayed along with markings on the waveform at specific signal-cycle pairs to indicate how the counterexample has changed as a result of applying the soft constraints.

In some embodiments, the debugging tool 110 displays a waveform for a partially updated trace before the debugging tool 110 finishes applying the soft constraints. Applying soft constraints can take a lengthy amount of time to complete, depending on the size and complexity of the circuit design, assumptions, properties, and soft-constraints. To increase the usability of the debugging tool 110 in these situations, the debugging tool 110 may display a waveform of a partially updated counterexample while the trace that best satisfies the soft constraints is being identified by the debugging tool 110. The partially updated counterexample may be displayed automatically according to a pre-defined configuration (e.g., whenever results are available) or in response to a user input requesting that it be displayed.

In some embodiments, after the updated trace is displayed, the debugging tool 110 allows the user to apply new soft or hard constraints to the updated counterexample trace, thereby generating a sequence of counterexample traces. To maintain similarity with the current trace, the current trace may be used as a soft constraint in determining the next trace. This creates a preference for similarity with the current trace, subject to the condition that the property is still violated. The debugging tool 110 thus attempts to make the next trace as similar as possible to current trace when applying the new constraint. For example, if the new constraint is a hard constraint, the resulting waveform highlights the forced changes caused by the hard constraint while reducing unnecessary changes to other signal-cycle pairs. As another example, if the new constraint is a soft constraint, the new constraint can be given a high priority while the soft constraint that prefers similarity with the current trace is given a lower priority.

The debugging tool 110 may also enable the user to jump between the traces in the sequence to compare differences between the traces. For example, the debugging tool 110 receives a user input selecting a trace for display. In response, the debugging tool 110 displays a waveform of the selected trace to the user. This enables the circuit designer to visualize how the trace changes on an incremental basis as new constraints are applied to the trace, which facilitates the process of debugging a circuit design.

An example of applying soft constraints in the debugging tool 110 is described. The debugging tool 110 uses the length of a counterexample trace (e.g., number of clock cycles in a trace), a circuit design, assumptions used by the trace, property failed by the trace, and soft constraints in determining the trace that best satisfies the soft constraints (the "optimal trace"). The debugging tool 110 synthesizes the circuit design into a mathematical model of the circuit design of the type that is commonly used in formal verification. For example, the debugging tool may use a Satisfiability (SAT) algorithm to unfold the logic of the circuit design over the length of the counterexample trace. The SAT model includes variables that represent the values of signal-cycle pairs in the circuit design. As another example, the model could be a Binary Decision Diagram. Signal-cycle pairs in the trace that should not be changed, such as those affected by assumptions, are marked as being frozen. Other signal-cycle pairs are left unfrozen so that the debugging tool 110 can optimize their values when applying the soft constraints. The debugging tool 110 then iteratively tests the mathematical model with different inputs to identify a trace that best satisfies the soft constraints while still complying with the assumptions.

Figure 2:
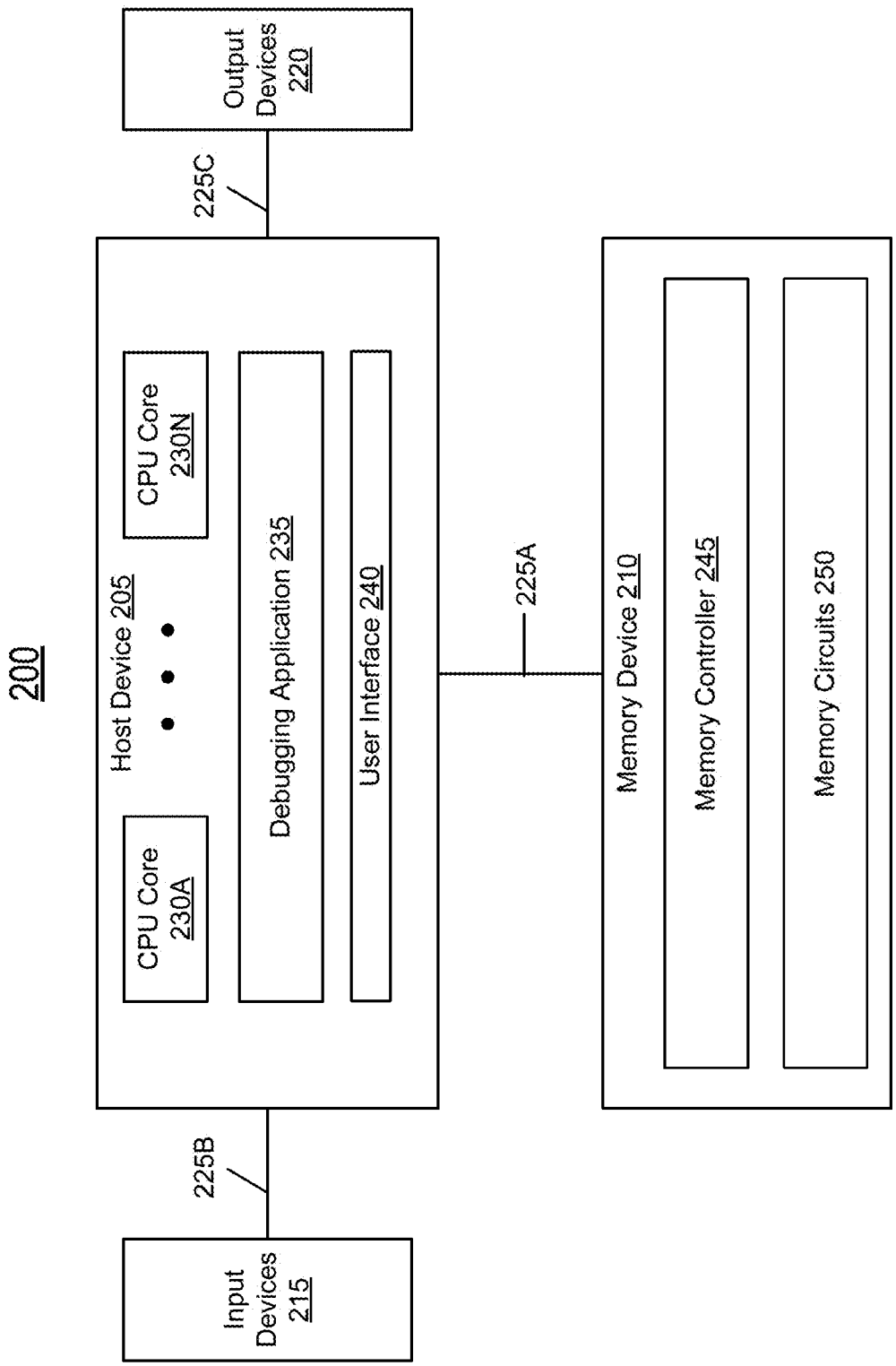
FIG. 2 illustrates a block diagram of a metastability debugging server, in accordance with some embodiments.

FIG. 2 illustrates an example block diagram of a metastability debugging server 200, in accordance with some embodiments. The metastability debugging server 200 is analogous to the metastability debugging server described in FIG. 1 and can include a static formal verification tool (e.g., static formal verification tool 150) and a debugging tool (e.g., debugging tool 110). Furthermore, any reference to the debugging tool may include any of the applications described herein, or any combination thereof.

In some embodiments, the metastability debugging server 200 includes a host device 205 associated with a memory device 210. The host device 205 may be configured to receive input from one or more input devices 215 and provide output to one or more output devices 220. The host device 205 may be configured to communicate with the memory device 210, the input devices 215, and the output devices 220 via appropriate interfaces or channels 225A, 225B, and 225C, respectively. The metastability debugging server 200 may be implemented in a variety of computing devices such as servers, computers (e.g., desktop, laptop, etc.), tablets, personal digital assistants, mobile devices, wearable computing devices such as smart watches, other handheld or portable devices, or any other computing unit suitable for performing operations described herein using the host device 205. The host device 205 may be operated by a circuit designer or other user that is trying to debug metastability issues in the circuit design.

Further, some or all of the features described in the present disclosure may be implemented on a client device, a server device, or a cloud/distributed computing environment (e.g., servers), or a combination thereof. For example, the features described herein may be implemented on an internet of things (IoT) platform and/or a cloud platform which may employ open application programming interfaces (e.g., APIs) to control other machines and/or devices that are connected through a network to the IoT platform and/or cloud platform. Additionally, unless otherwise indicated, functions described herein as being performed by a computing device may be implemented by multiple computing devices in a distributed environment, and vice versa.

The input devices 215 may include any of a variety of input technologies such as a keyboard, stylus, touch screen, mouse, track ball, keypad, microphone, voice recognition, motion recognition, remote controllers, input ports, one or more buttons, dials, joysticks, and any other input peripheral that is associated with the host device 205 and that allows an external source, such as a user, to enter information (e.g., data) into the host device and send instructions to the host device 205. Similarly, the output devices 220 may include a variety of output technologies such as external memories, speakers, displays, microphones, light emitting diodes, headphones, plotters, speech generating devices, video devices, global positioning systems, and any other output peripherals that are configured to receive information (e.g., data) from the host device 205. The "data" that is either input into the host device 205 and/or output from the host device may include any of a variety of circuit design data, verification data, assertion data, debugging tool data, combinations thereof, or other types of analog and/or digital data that is suitable for processing using the metastability debugging server 200.

The host device 205 may include one or more Central Processing Unit ("CPU") cores or processors 230A-230N that may be configured to execute instructions for running one or more applications associated with the host device 205. In some embodiments, the instructions and data needed to run the one or more applications may be stored within the memory device 210. The host device 205 may also be configured to store the results of running the one or more applications within the memory device 210. One such application on the host device 205 may include a debugging application 235. The debugging application 235 may implement a static formal verification tool algorithm (e.g., functions of the static formal verification tool 150) and/or a debugging tool algorithm (e.g., functions of the debugging tool 150). The debugging application 235 may be executed by one or more of the CPU cores 230A-230N. The instructions to execute the debugging application 235 may be stored within the memory device 210.

In some embodiments, the static formal verification tool algorithm and the debugging tool algorithm may be configured to execute functions related to formal verification and/or debugging metastability issues as described herein. As explained above, debugging metastability issues in circuit designs can be time-consuming, expensive, and very difficult to capture all metastability issues during the debugging process. The metastability debugging server 200 may solve this problem by running formal verification using mathematical models and automatically identifying the culprit CDC pair(s) that lead to failed assertions (or counterexamples). In this way, the metastability debugging server 200 is able to help reduce the time and cost of debugging metastability issues.

Thus, the host device 205 may be configured to request the memory device 210 to perform a variety of operations. For example, the host device 205 may request the memory device 210 to read data, write data, update or delete data, and/or perform management or other operations. The host device 205 may also include a user interface 240 which may be may include any mechanism displaying information about the metastability debugging server 200 and allowing an operator to interact with and/or provide data to the metastability debugging server 200. In some embodiments, a user associated with a circuit design may utilize the user interface 240 to send instructions to CPU cores 230A-230N and/or the debugging application 235 using APIs.

In some embodiments, the user interface 240 may be accessed via an API (not shown). To access the user interface 240 via the API, a user may use designated devices such as laptops, desktops, tablets, mobile devices, other handheld or portable devices, and/or other types of computing devices that are configured to access the API. These devices may be different from the computing device on which the metastability debugging server 200 is installed. In some embodiments and when the user interface 240 is configured for access via the API, the user may access the user interface via a web browser and upon entering a uniform resource locator ("URL") for the API such as the IP address of the metastability debugging server 200 or other web address. Using the API and the user interface 240, the users may then send instructions to the debugging application 235 and receive information back from the debugging application 235. In some embodiments, the API may be a representational state transfer ("REST") type of API. In other embodiments, the API may be any other type of web or other type of API (e.g., ASP.NET) built using any of a variety of technologies, such as Java, .Net, etc., that is capable of accessing the user interface 240 and facilitating communication between the users and the debugging application 235. In some embodiments, the API may be configured to facilitate communication via a hypertext transfer protocol ("HTTP") or hypertext transfer protocol secure ("HTTPS") type request. The API may receive an HTTP/HTTPS request and send an HTTP/HTTPS response back. In other embodiments, the API may be configured to facilitate communication using other or additional types of communication protocols. In other embodiments, the metastability debugging server 200 may be configured for access in other ways. The user interface 240, thus, facilitates human-computer interaction between the users and the metastability debugging server 200. The user interface 240 may be configured as a graphical user interface ("GUI"), text-based user interfaces, or other man-machine interfaces.

To facilitate communication with the memory device 210, the memory device 210 may include or be associated with a memory controller 245. Although the memory controller 245 is shown as being part of the memory device 210, in some embodiments, the memory controller 245 may instead be part of the host device 205 or another element of the metastability debugging server 200 and operatively associated with the memory device 210. The memory controller 245 may be configured as a logical block or circuitry that receives instructions from the host device 205 and performs operations in accordance with those instructions. For example, when the execution of the debugging application 235 is desired, the host device 205 may send a request to the memory controller 245. The memory controller 245 may read the instructions associated with the debugging application 235 that are stored within the memory device 210, and send those instructions back to the host device 205. In some embodiments, those instructions may be temporarily stored within a memory on the host device 205. One or more of the CPU cores 230A-230N may then execute those instructions by performing one or more operations called for by those instructions of the debugging application 235.

The memory device 210 may include one or more memory circuits 250 that store data and instructions for the circuit design, verification specification, verification results, and any other data that is input or generated by the metastability debugging server 200. The memory circuits 250 may be any of a variety of memory types, including a variety of volatile memories, non-volatile memories, or a combination thereof. For example, in some embodiments, one or more of the memory circuits 250 or portions thereof may include NAND flash memory cores. In other embodiments, one or more of the memory circuits 250 or portions thereof may include NOR flash memory cores, Static Random Access Memory (SRAM) cores, Dynamic Random Access Memory (DRAM) cores, Magnetoresistive Random Access Memory (MRAM) cores, Phase Change Memory (PCM) cores, Resistive Random Access Memory (ReRAM) cores, 3D XPoint memory cores, ferroelectric random-access memory (FeRAM) cores, and other types of memory cores that are suitable for use within the memory device 210. In some embodiments, one or more of the memory circuits 250 or portions thereof may be configured as other types of storage class memory ("SCM"). Generally speaking, the memory circuits 250 may include any of a variety of Random Access Memory (RAM), Read-Only Memory (ROM), Programmable ROM (PROM), Erasable PROM (EPROM), Electrically EPROM (EEPROM), hard disk drives, flash drives, memory tapes, cloud memory, or any combination of primary and/or secondary memory that is suitable for performing the operations described herein.

It is to be understood that only some components of the metastability debugging server 200 are shown and described in FIG. 2. However, the metastability debugging server 200 may include other components such as various batteries and power sources, networking interfaces, routers, switches, external memory systems, controllers, etc. Generally speaking, the metastability debugging server 200 may include any of a variety of hardware, software, and/or firmware components that are needed or considered desirable in performing the functions described herein. Similarly, the host device 205, the input devices 215, the output devices 220, and the memory device 210, including the memory controller 245 and the memory circuits 250, may include hardware, software, and/or firmware components that are considered necessary or desirable in performing the functions described herein. In addition, in certain embodiments, the memory device 210 may integrate some or all of the components of the host device 205, including, for example, the CPU cores 230A-230N, and the CPU cores may be configured to execute debugging application 235, as described herein.

While the metastability debugging server 200 has been illustrated in various figure(s) as a physical device, it is contemplated that it could exist instead as a virtual device operating on a virtual machine. While the metastability debugging server 200 has been illustrated in various figures as a single device, it is contemplated that a metastability debugging server performing the same (or substantially similar) functions as the metastability debugging server 200 could be a virtualized device that is instantiated across one or more physical and/or virtual machines.

Figure 3A:
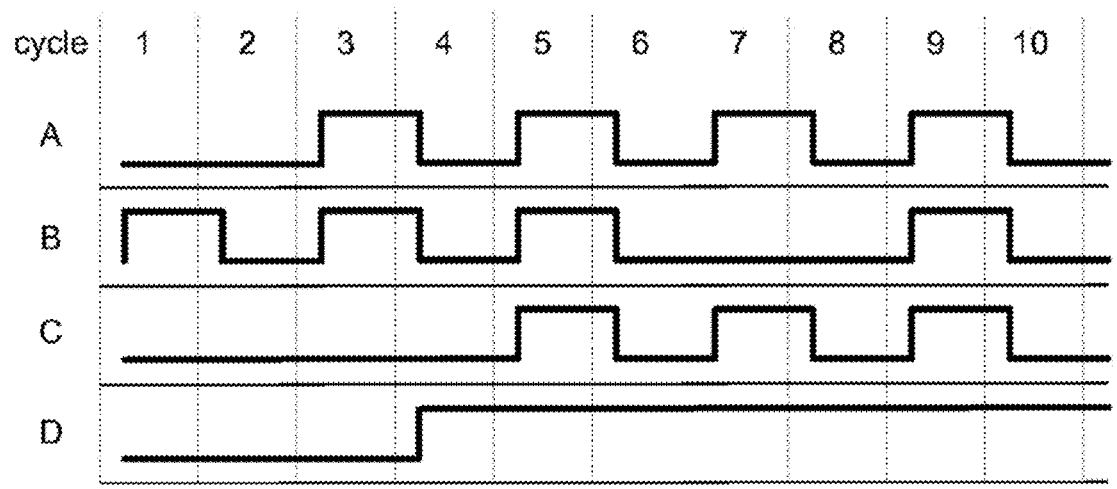
FIG. 3A illustrates a graph of waveforms of a counterexample before soft constraints are applied, according to some embodiments.

FIG. 3A illustrates a graph 300A of waveforms of a counterexample before soft constraints are applied, according to some embodiments. As shown, this is a waveform of a counterexample trace with four signals, signals A, B, C, and D, that are input signals of a circuit design. The example counterexample trace violates some property P (not shown). The length of the counterexample trace is ten clock cycles. Signal A has eight signal transitions, signal B has eight signal transitions, signal C has six signal transitions, and signal D has one signal transition. The waveform is fairly noisy and has a total of 23 signal transitions. From a circuit designer's perspective, the waveform could be considered difficult to debug because of the high amount of activity occurring in the waveform. Thus, a designer might prefer the waveform to appear quieter and with fewer signal transitions.

Figure 3B:
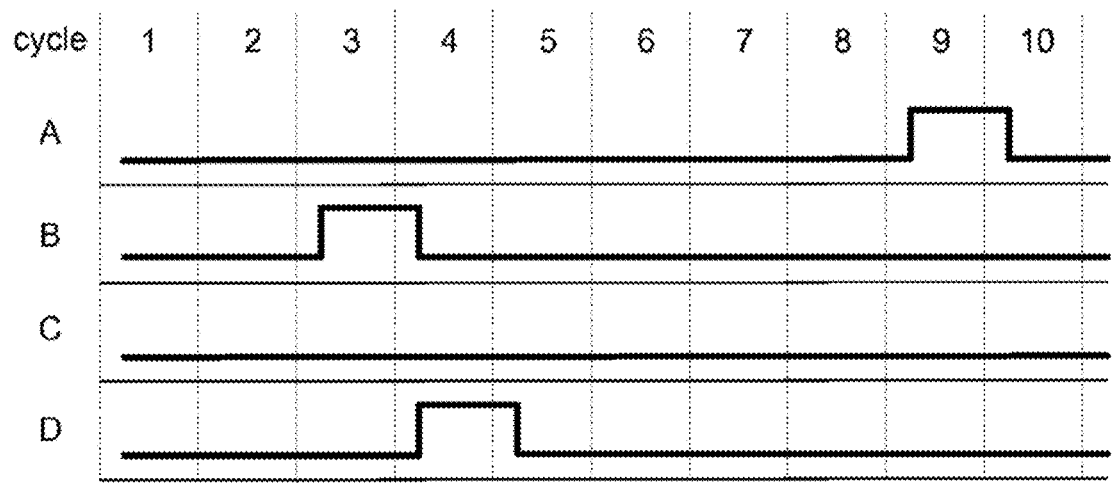
FIG. 3B illustrates a graph for displaying the waveforms of FIG. 3A after soft constraints are applied, according to some embodiments.

FIG. 3B illustrates a graph 300B for displaying the waveforms of FIG. 3A after soft constraints are applied, according to some embodiments. In this example the applied soft constraint attempts to force all signal-cycle pairs to logic 0, subject to the condition that the resulting trace must still violate the property P. As shown, the resulting waveform is much quieter than the waveform in FIG. 3A and is thus easier to understand. Signals A, B, and D now have two signal transitions, and signal C has zero signal transitions. Additionally, by suppressing unnecessary activity, the quieted trace helps to highlight signal-cycle pairs that necessarily contribute to the violation of the property. For example, signal-cycle pairs A-9, B-3, and D-4 must contribute to the violation of the property P because they were not able to satisfy the applied soft constraint. The example graph 300B may be generated by using the debugging software technology as described in U.S. Pat. No. 8,863,049, which is hereby incorporated by reference. A trace based design navigation, as described in U.S. Pat. No. 7,137,078, which is hereby incorporated by reference, can be applied recursively to determine the signals relevant in the fan-in cone (e.g., the COI) with respect to the completed transactions, and the debugging software technology can be used to make such identification even more effectively due to the reduced set of relevant signals.

Figure 4:
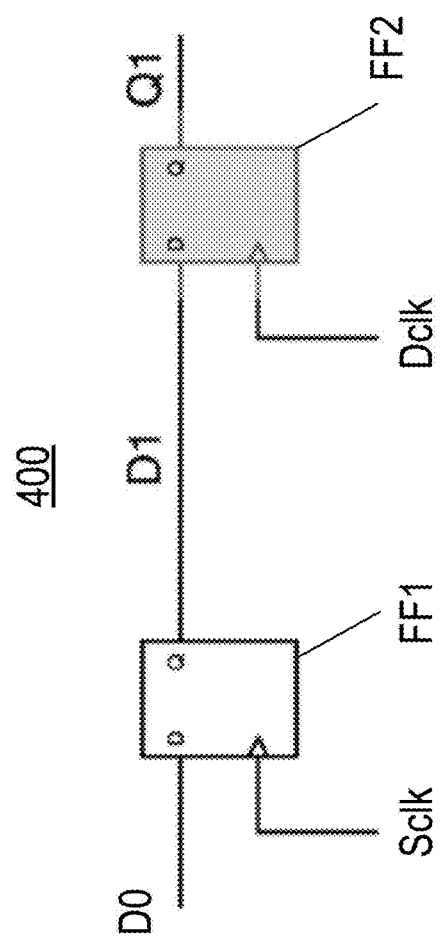
FIG. 4 illustrates a circuit that may have metastability issues, in accordance with some embodiments.

FIG. 4 illustrates a circuit 400 that may have metastability issues, in accordance with some embodiments. The circuit 400 includes flip-flops FF1 and FF2 and two asynchronous clocks (e.g., asynchronous with respect to each other) SCLK and DCLK. A data signal DO is input to the flip-flop FF1, which outputs a data signal D1 from flip-flop FF1. The data signal D1 is input to the flip-flop FF2, and a data signal Q1 is output from flip-flop FF2. The circuit 400 is illustrated to demonstrate how metastability may occur during a CDC scenario, but embodiments are not limited thereto, and the disclosed technology can be applied to RDC scenarios as well.

The flip-flops FF1 and FF2 may include positive-edge triggered D-flip-flops in FIG. 1, but embodiments are not limited thereto, and the flip-flops SCLK and DCLK may include a variety of other types of flip-flops. For example, the flip-flops may FF1 and FF2 include negative-edge triggered flip-flops, S-R flip-flops, J-K flip-flops, T flip-flops, etc. In some embodiments, the flip-flops FF1 and FF2 may include reset signals.

The clocks SCLK and DCLK are on clock domains (or asynchronous with respect to each other). The data signal D1 is crossing clock domains because the flip-flop FF1 operates in the domain of clock SCLK and the flip-flop FF2 operates in the domain of clock DCLK. Accordingly, the data signal D1 may not be properly stored in the flip-flop FF2 if the setup and hold times are not held long enough. The setup time is the amount of time the data signal D1 needs to stay stable prior to the positive edge of the clock DCLK (e.g., when the clock DCLK transitions from "0" to "1"). The hold time is the amount of time the data signal D1 needs to stay stable after the positive edge of the clock DCLK. If either of the setup time or hold time constraints (or requirements) is violated, the data signal D1 may not be properly saved to the flip-flop FF2, which may cause the data signal Q1 output from flip-flop FF2 to enter a metastable state and become unpredictable.

Figure 5:
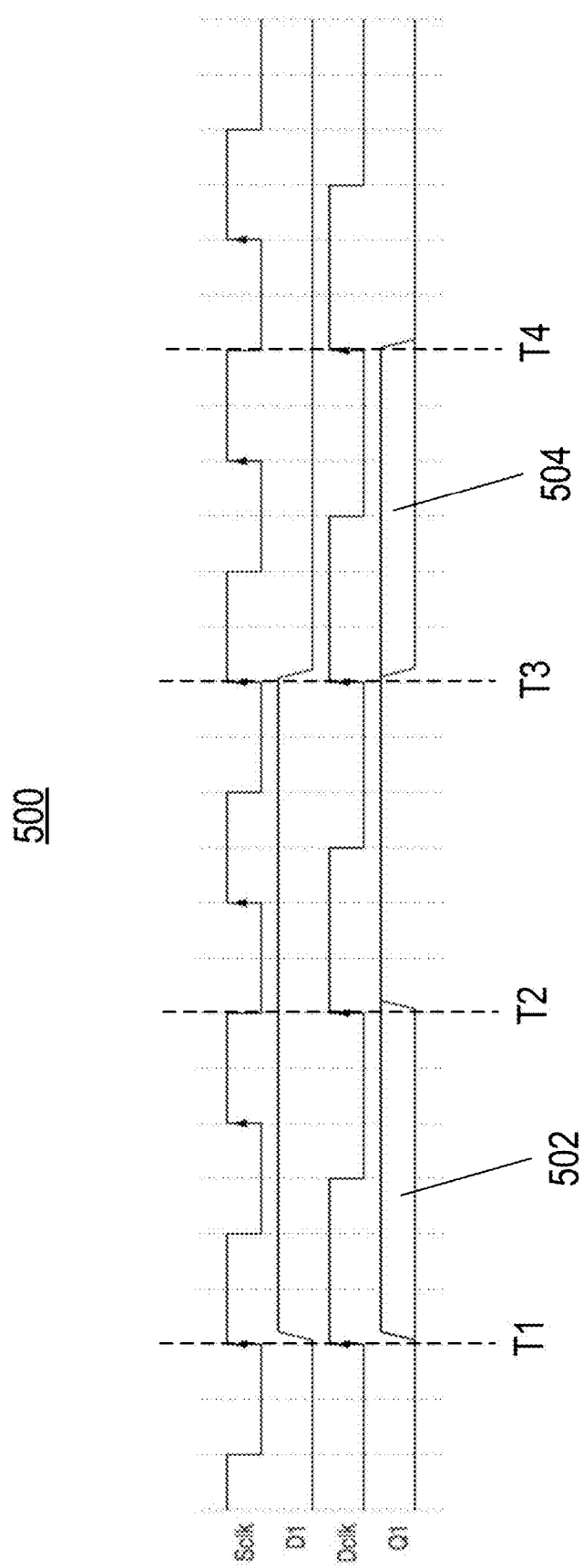
FIG. 5 illustrates a graph showing example waveforms to illustrate how metastability injection modeling works using the signals of the circuit from FIG. 4, in accordance with some embodiments.

FIG. 5 illustrates a graph 500 showing example waveforms to illustrate how metastability injection modeling works using the signals of the circuit 400 from FIG. 4, in accordance with some embodiments. The graph 500 includes waveforms for the clocks Sclk and Dclk and the data signals D1 and Q1 of FIG. 4. Although the waveforms have a certain shape, embodiments are not limited thereto, and the waveforms may have different shapes.

Metastability injection modeling is a verification method that can be used to determine whether or not the design under test (DUT) is resilient against metastability effects. Generally, a debugging application that employs injection modeling can inject errors into the models by setting one or more signals to have one or more states for the purposes of verification. In the case of metastability injection modeling, the injection modeling can model the effect of metastability in every CDC pair or path in the cone of influence (COI) of the assertion. When the injection modeling is applied, the model allows for a 1-cycle delay of uncertainty at the destination register of each CDC pair. Formal verification that uses injection modeling can cause the output of the destination register to retain the previous value (e.g., the value that was previously input to the destination register) or have the new value (e.g., the value that was newly input to the destination register). Then the user is able to see what effect metastability has on the functionality of the design by checking whether or not the assertions have been proven. If the assertion passes, the user knows that the design is resilient against metastability. However, if the assertion fails, the user needs to find out where the critical CDC path is (e.g., the CDC path that is causing the metastability to occur and cause the failure) and debug metastability issue.

Referring to FIG. 5, the clock Sclk has a period that is shorter than the clock Dclk. The transitions of the clock Sclk happens around the same time as the transitions for the clock Dclk. For example, around time T1, both the clock Dclk and the data signal D1 are transitioning from "0" to "1." When this occurs, the time it takes for the data signal D1 to settle at the input of the flip-flop FF2 may be long and violate the setup and/or hold times of the flip-flop FF2. When the formal verification model detects this type of potentially metastable situation, the debugging tool that employs injection modeling can set a state 502 of the data signal Q1 to be either "0" (for the situation when the data signal Q1 settled on "0") or "1" (for the situation if the data signal Q1 settled on "1"). Then the debugging tool can set the data signal Q1 to be "1" around time T2 because the data signal D1 has been reliably "1" before and after the positive-edge transition of the clock Dclk.

For example, around time T3, the data signal D1 is transitioning from "1" to "0" at the positive-edge transition of the clock Dclk. When this occurs, the time it takes for the data signal D1 to settle at the input of the flip-flop FF2 may be long and violate the setup and/or hold times of the flip-flop FF2. When the formal verification model detects this type of potentially metastable situation, the debugging tool that employs injection modeling can set a state 504 of the data signal Q1 to be either "0" (for the situation when the data signal Q1 settled on "0") or "1" (for the situation if the data signal Q1 settled on "1"). Then the debugging tool can set the data signal Q1 to be "0" around time T4 because the data signal D1 has been reliably "0" before and after the positive-edge transition of the clock Dclk.

In some embodiments, when metastability injection is applied, the static formal verification tool 150 and/or the debugging tool 110 may randomly set the output of the destination register to a previous value stored in the destination register or a new value received at the input of the destination register. The random setting can similarly mimic a metastability effect occurring.

Figure 6:
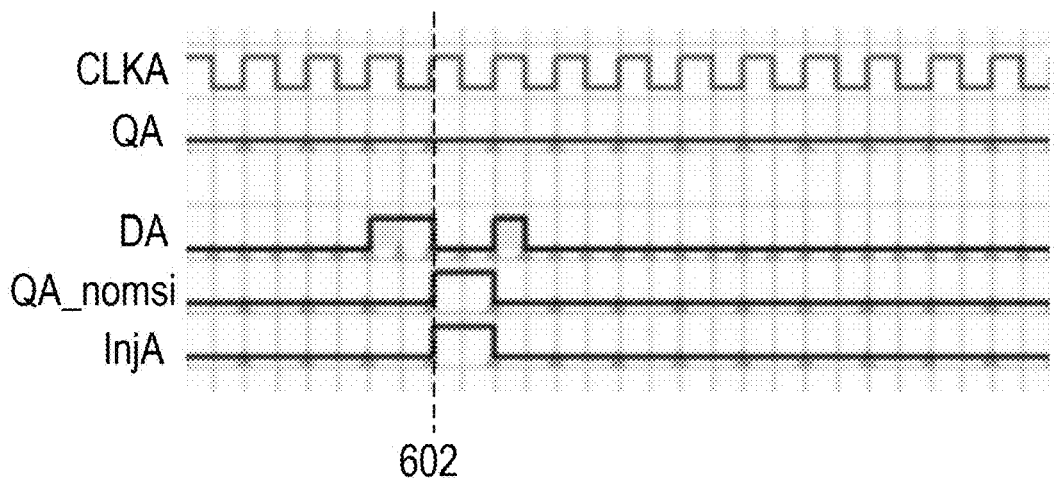
FIG. 6 illustrates graphs of waveforms of CDC pairs that may have caused failures in metastability, in accordance with some embodiments.
Figure 6:
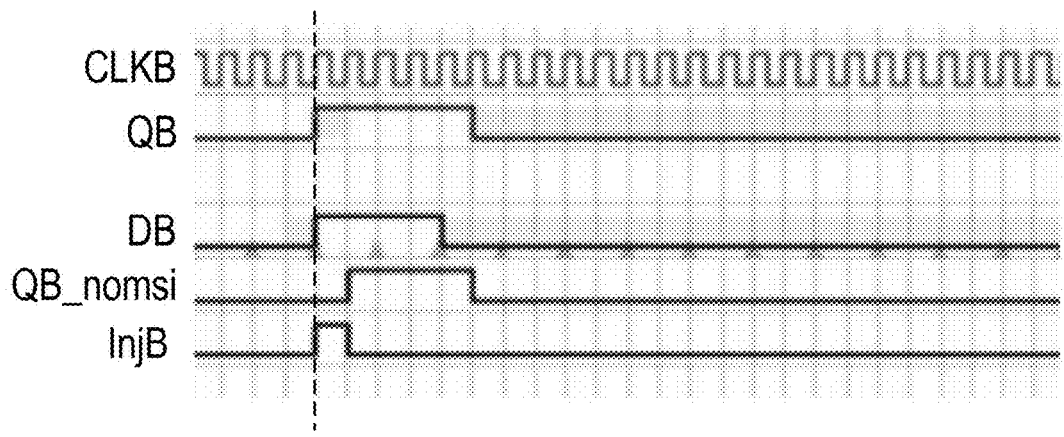
Figure 6:
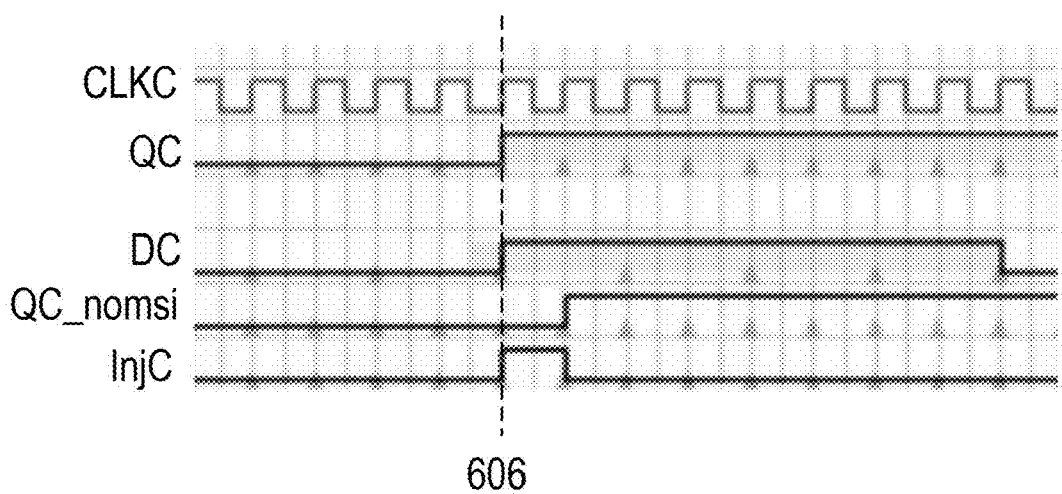

FIG. 6 illustrates graphs 600A, 600B, and 600C of waveforms of CDC pairs that may have caused failures in metastability, in accordance with some embodiments. The waveforms show three groups of signals that pertain to their respective CDC pair. However, embodiments are not limited thereto, and there may be more or fewer groups of signals that can be analyzed, and each group may include more or fewer signals that can be shown. The graphs 600A-600C may be generated using a debugging tool. For example, the user may provide a command in the debugging tool to generate waveforms for the CDC pairs that were in the COI of the failed assertion.

When assertions are written, there may be one or more influencing signals that influence the assertion. And there may be one or more drivers (e.g., input signals and/or any circuit that uses the input signals to drive the one or more influencing signals) that generate the one or more influencing signals. The COI may be defined as the one or more drivers as well as the one or more influencing signals. When an assertion fails, the debugging tool may generate the waveforms shown in FIG. 6 that show all of the CDC pairs and their signals that affected the assertion.

While running formal verification, an assertion may fail and show that a design did not pass because a counterexample was found in which the assertion failed. The COI of the assertion may include three CDC pairs on the CDC path. Each CDC pair may be represented as a group of signals as shown in FIG. 6. A first group 600A of waveforms can include some waveforms for a first CDC pair, a second group 600B of waveforms can include some waveforms for a second CDC pair, and a third group 600C of waveforms can include some waveforms for a third CDC pair. The shapes, sizes, and timing of the transitions of the waveforms of FIG. 6 are merely examples, and embodiments are not limited thereto.

The first group 600A includes waveforms for a clock CLKA, output signal QA, input signal DA, non-injection output signal QA_nomsi, and injection signal InjA. The second group 600B includes waveforms for a clock CLKB, output signal QB, input signal DB, non-injection output signal QB_nomsi, and injection signal InjB. The third group 600C includes waveforms for a clock CLKC, output signal QC, input signal DC, non-injection output signal QC_nomsi, and injection signal InjC.

Each of the clocks CLKA, CLKB, and CLKC are clock signals of the destination flip-flop (e.g., clock Dclk of FIG. 4) of their respective CDC pair. The output signals QA, QB, and QC are data signals that are output by the destination flip-flop (e.g., data signal Q1 of FIG. 4) of the respective CDC pair. The input signals DA, DB, and DC are the data signals that are output by the source flip-flop and input at the destination flip-flop (e.g., data signal D1 of FIG. 4) of the respective CDC pair.

The non-injection output signals QA_nomsi, QB_nomsi, and QC_nomsi are respectively signals that the output signals QA, QB, and QC would have been if there was no metastability injection for the respective CDC pair. For example, if there were no metastability issues, the waveforms of the QA, QB, and QC would look like non-injection output signals QA_nomsi, QB_nomsi, and QC_nomsi, respectively.

The injection signals InjA, InjB, and InjC indicate when an injection occurred at the output of the destination register. For example, the injection signals InjA, InjB, and InjC indicate when the debugging tool forced the output of the destination register to be equal to "1" or "0." The fact that an injection occurred indicates that the output signal was metastable. For example, when the injection signal InjA transitions high at time 602, it is an indication that the first CDC pair may have caused the assertion to fail due to metastability. Similarly, when the injection signal InjB transitions high at time 604, it is an indication that the second CDC pair may have caused the assertion to fail due to metastability. And when the injection signal InjC transitions high at time 606, it is an indication that the third CDC pair may have caused the assertion to fail due to metastability.

Figure 7:
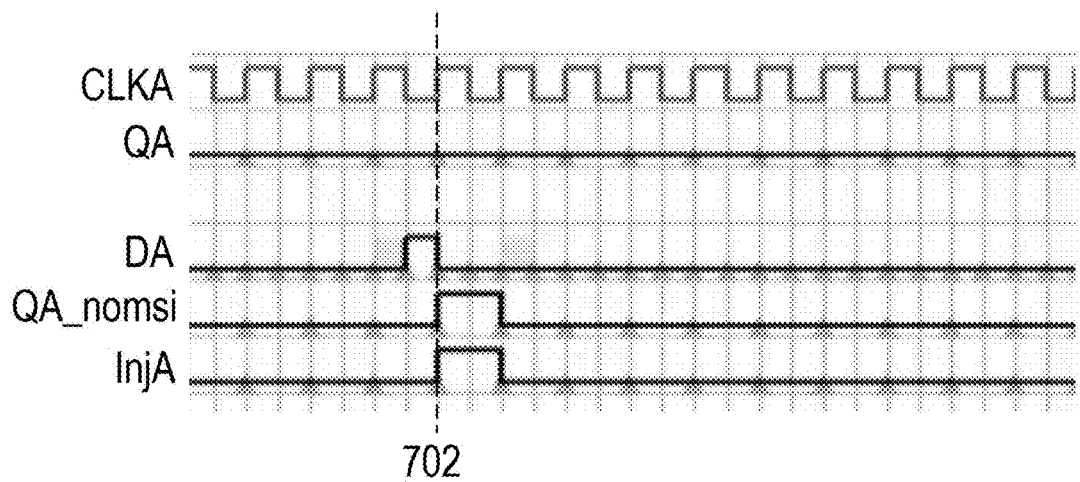
FIG. 7 illustrates graph of waveforms of the signals of FIG. 6 after quieting the CDC pairs that do not affect the failed assertion, in accordance with some embodiments.
Figure 7:
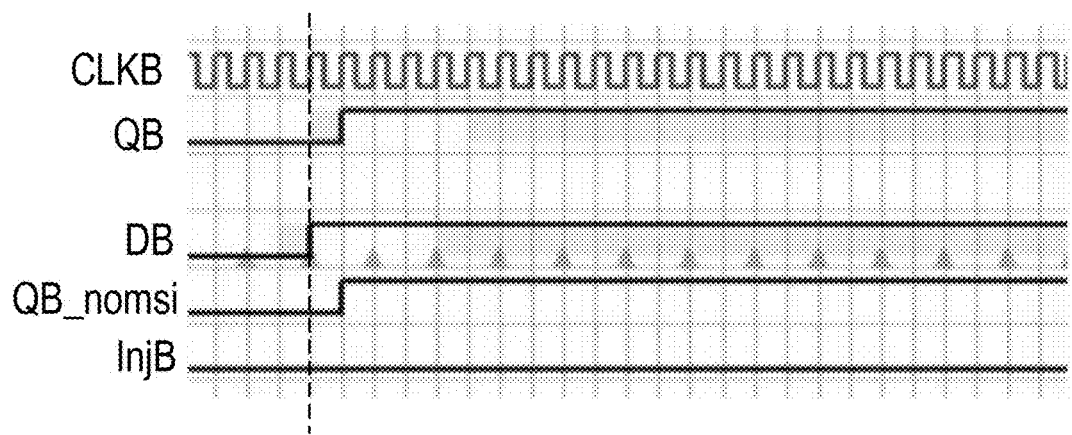
Figure 7:
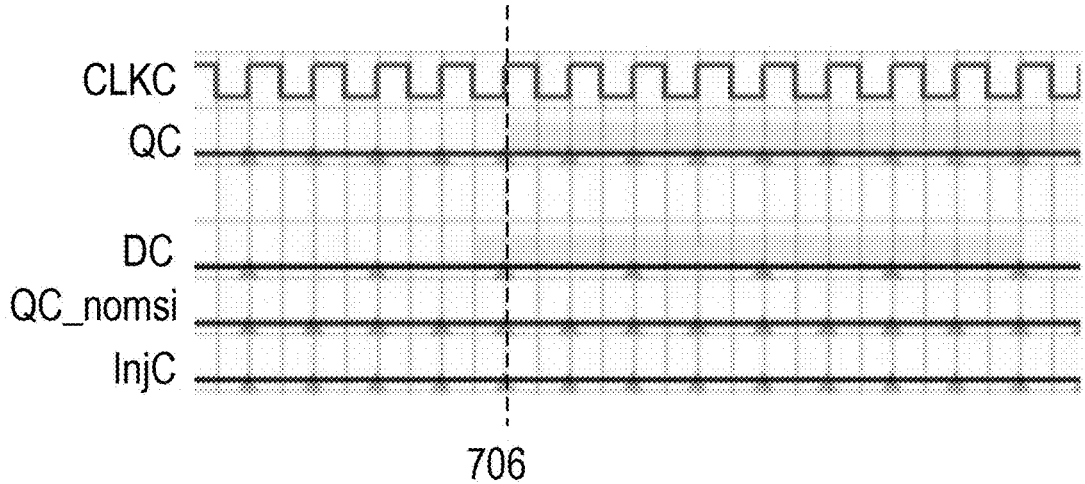

FIG. 7 illustrates graphs 700A, 700B, and 700C of waveforms of the signals of FIG. 6 after quieting the CDC pairs that do not affect the failed assertion, in accordance with some embodiments. Similar to FIG. 6, the waveforms show three groups of signals that pertain to their respective CDC pair. After the waveforms of FIG. 6 have been plotted, a function on the debugging tool can be executed that minimize the injection signals, which can force the input conditions in a way such that as many injection signals as possible are set to "0." For example, the CDC pairs that are not responsible for the failure of the assertion can be removed. One or more soft constraints may be applied. For example, a soft constraint coded expression that states "force as many input signals of the CDC pair as possible to 0 and still being able to find a trace of the same length." As another example, the soft constraint coded expression that states "all injection signals of the CDC pair are set to '0' without failing the assertion." Then the debugging tool may apply the soft constraint to generate the updated trace as shown in FIG. 7.

Within the COI, there may be multiple drivers and influencing signals that lead to the failed assertion. However, not all of the drivers and influencing signals always cause the assertion to fail. Accordingly, when analyzing the counter-example, the user may wish to know which of the signals and/or drivers contributed to the failed assertion. The debugging tool may isolate the influencing signals and drivers in the COI that caused the failed assertion.

In graph 700A, the injection signal InjA transitioned high at time 702. This indicates that the first CDC pair was a cause to the failed assertion. Accordingly, the user who sees the injection signal InjA transition high knows to check the first CDC pair's CDC path and consider different ways to remove the metastability issue, such as by adding a synchronizer at the destination register.

In each of graphs 700B and 700C, the injection signals InjB and InjC are set to "0" for the entire duration of the trace captured in FIG. 7. Accordingly, the injection did not cause the assertion to fail. Accordingly, the user knows that the second and third CDC pairs may be ignored for the purposes of analyzing why the assertion failed.

Figure 8:
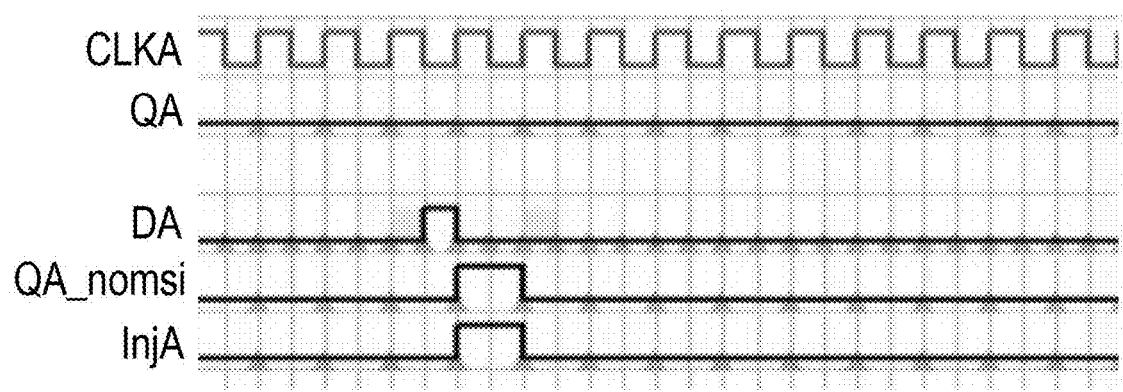
FIG. 8 illustrates a new display shows the only CDC pair that is responsible for the failed assertion, in accordance with some embodiments.

FIG. 8 illustrates a new display 800 shows the only CDC pair that is responsible for the failed assertion, in accordance with some embodiments. After the soft constraint is applied and the CDC pairs that were not the cause of the metastability injection are removed, the display 800 may be generated so that the user is able to know which CDC pair needs to be further analyzed to remove any debug errors.

Figure 9:
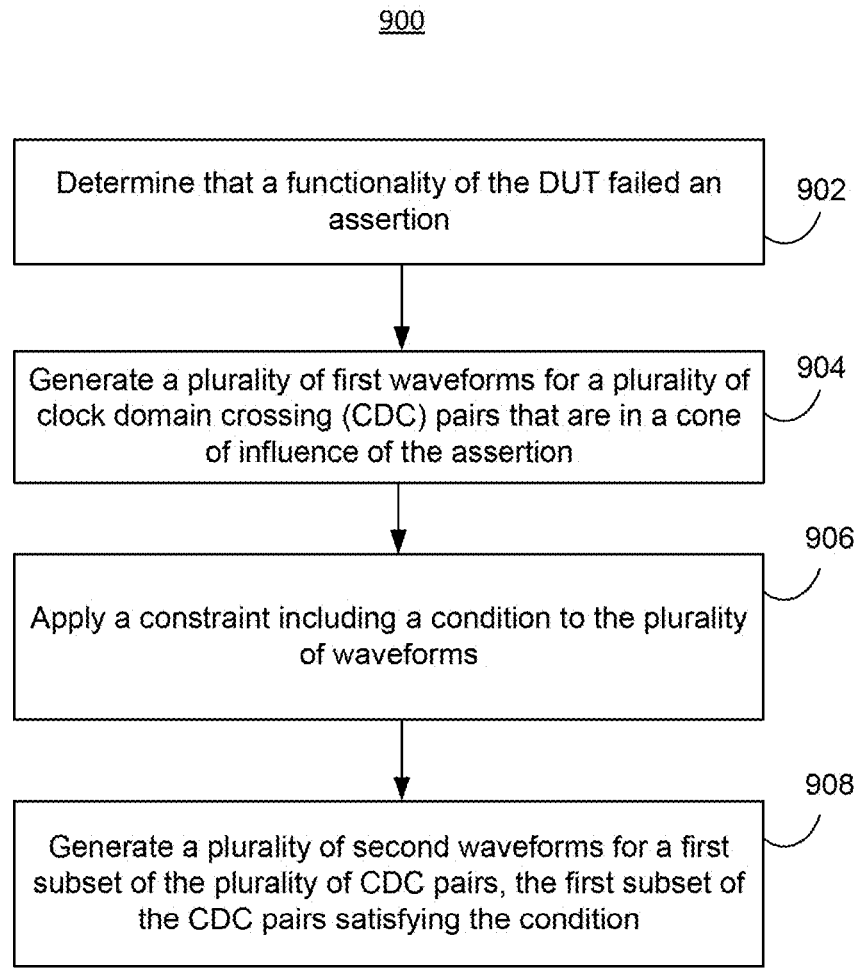
FIG. 9 illustrates flow chart of a method of debugging a DUT using formal verification, in accordance with some embodiments.

FIG. 9 illustrates flow chart of a method 900 of debugging a DUT using formal verification, in accordance with some embodiments. For example, the metastability debugging server 200 can perform method 900, but embodiments are not limited thereto. It is to be understood that present implementations are not limited to the particular examples disclosed herein.

Step 902 includes determining that a functionality of the DUT failed an assertion. Metastability injection modeling as discussed above may be used to determine whether metastability will affect the functionality of the DUT.

Step 904 includes generating a plurality of first waveforms for a plurality of CDC pairs that are in a COI of the assertion. The first waveforms may include all of the CDC pairs that had an injection at the output of the destination register of the CDC pair. In some embodiments, the first waveforms may be drawn using the CDC pairs that had an injection at the output of the destination pair and the injection was different than what was expected. For example, the waveforms may be generated if the output of the destination register was expected to be logic 0 and the injection output was logic 1. Similarly, the waveforms may be generated if the output of the destination register was expected to be logic 1 and the injection output was logic 0.

Step 906 includes applying a constraint to the plurality of waveforms, the constraint including a condition. The constraint may include a soft constraint. Applying the constraint to the waveforms may result in the injection signals for some of the CDC pairs being logic 0 for the entire trace, which indicates that the CDC pair was not CDC pair that was problematic with respect to the failed assertion. The user may provide one command or input to apply the constraint for all of the CDC pairs.

Step 908 includes generating a plurality of second waveforms for a first subset of the plurality of CDC pairs. The first subset of the CDC pairs satisfied the condition. The server may generate a new window or display that generates only the CDC pair(s) that had a metastability injection that caused the assertion failure.

Accordingly, the user is able to determine very quickly which CDC pair was causing the metastability issue and the failed assertion for further debugging.

The herein described subject matter sometimes illustrates different components contained within, or connected with, different other components. It is to be understood that such depicted architectures are illustrative, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.).

Although the figures and description may illustrate a specific order of method steps, the order of such steps may differ from what is depicted and described, unless specified differently above. Also, two or more steps may be performed concurrently or with partial concurrence, unless specified differently above. Such variation may depend, for example, on the software and hardware systems chosen and on designer choice. All such variations are within the scope of the disclosure. Likewise, software implementations of the described methods could be accomplished with standard programming techniques with rule-based logic and other logic to accomplish the various connection steps, processing steps, comparison steps, and decision steps.

It will be further understood by those within the art that if a specific number of an introduced claim recitation is intended, such an intent will be explicitly recited in the claim, and in the absence of such recitation, no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general, such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

Further, unless otherwise noted, the use of the words "approximate," "about," "around," "substantially," etc., mean plus or minus ten percent.

The foregoing description of illustrative implementations has been presented for purposes of illustration and of description. It is not intended to be exhaustive or limiting with respect to the precise form disclosed, and modifications and variations are possible in light of the above teachings or may be acquired from practice of the disclosed implementations. It is intended that the scope of the invention be defined by the claims appended hereto and their equivalents.

What is claimed is:

1. A method for debugging a design under test (DUT) for metastability issues using formal verification, the method comprising:
   determining, by a server, that a functionality of the DUT failed an assertion;
   generating, by the server, a plurality of first waveforms for a plurality of clock domain crossing (CDC) pairs that are in a cone of influence (COI) of the assertion;
   applying, by the server, a constraint including a condition to the plurality of first waveforms; and
   generating, by the server, one or more second waveforms for a first subset of the plurality of CDC pairs, wherein the first subset of the CDC pairs satisfied the condition.

2. The method of claim 1, further comprising:
   injecting, by the server, a metastability effect at an output of a destination register of the CDC pair by randomly setting the output to include a previous value in a first setting and a new value in a second setting; and
   based on the set output, determining, by the server, whether the metastability at the output of the destination register affected the functionality of the DUT.

3. The method of claim 2, further comprising:
   storing, by the server in a memory, an indicator of the destination register of the first subset of CDC pairs; and discarding, by the server, an indicator of the destination register of the plurality of CDC pairs that are not included in the first subset of CDC pairs.

4. The method of claim 2, wherein a waveform of the plurality of first waveforms and the one or more second waveforms includes a waveform for a signal that indicates whether or not metastability occurred.

5. The method of claim 2, wherein the determination of whether the metastability affected the functionality of the DUT comprises:
comparing, by the server, an expected output of the destination register to a calculated output of the register that was injected with metastability; and
based on the comparison, determining, by the server, that the expected output is not the same as the calculated output.

6. The method of claim 1, wherein the COI includes one or more signals of the CDC pair and one or more drivers that affect the one or more signals.

7. The method of claim 1, further comprising identifying, by the server, a second subset of the CDC pairs that did not satisfy the condition.

8. The method of claim 1, further comprising receiving, by the server, a user input including a command to apply the constraint to remove CDC pairs that do not affect the assertion.

9. A system for debugging a design under test (DUT) for metastability issues using formal verification, the system comprising:
one or more processor having instructions stored thereon that, when executed by the one or more processors, causes the one or more processors to:
determine that a functionality of the DUT failed an assertion;
inject a metastability effect to a plurality of clock domain crossing (CDC) pairs that are in a cone of influence (COI) of the assertion;
generate a plurality of first waveforms for the plurality of CDC pairs;
apply a constraint including a condition to the plurality of first waveforms; and
generate one or more second waveforms for a first subset of the plurality of CDC pairs, wherein the first subset of the CDC pairs satisfied the condition.

10. The system of claim 9, wherein the injection of the metastability effect includes injecting the metastability effect at an output of a destination register of the CDC pair by randomly setting the output to include a previous value in a first setting and a new value in a second setting, and wherein the instructions further cause the one or more processors to, based on the set output, determine whether the metastability at the output of the destination register affected the functionality of the DUT.

11. The system of claim 10, wherein the instructions further cause the one or more processors to:
store an indicator of the destination register of the first subset of CDC pairs; and
discard an indicator of the destination register of the plurality of CDC pairs that are not included in the first subset of CDC pairs.

12. The system of claim 10, wherein a waveform of the plurality of first waveforms and the one or more second waveforms includes a waveform for a signal that indicates whether or not metastability occurred.

13. The system of claim 10, wherein the instructions further cause the one or more processors to:
compare an expected output of the destination register to a calculated output of the register that was injected with metastability; and
based on the comparison, determine that the expected output is not the same as the calculated output.

14. The system of claim 9, wherein the COI includes one or more signals of the CDC pair and one or more drivers that affect the one or more signals.

15. The system of claim 9, wherein the instructions further cause the one or more processors to identify a second subset of the CDC pairs that did not satisfy the condition.

16. The system of claim 9, wherein the instructions further cause the one or more processors to receive a user input including a command to apply the constraint to remove CDC pairs that do not affect the assertion.

17. A non-transitory computer readable medium including one or more instructions stored thereon and executable by a processor to:
determine that a functionality of the DUT failed an assertion;
generate a plurality of first waveforms for a plurality of clock domain crossing (CDC) pairs that are in a cone of influence (COI) of the assertion;
apply a constraint including a condition to the plurality of first waveforms; and
remove a subset of the first waveforms of the plurality of CDC pairs that did not satisfy the condition.

18. The non-transitory computer readable medium of claim 17, wherein the instructions further cause the processor to:
inject a metastability effect at an output of a destination register of the CDC pair by randomly setting the output to include a previous value in a first setting and a new value in a second setting; and
based on the set output, determine whether the metastability at the output of the destination register affected the functionality of the DUT.

19. The non-transitory computer readable medium of claim 18, wherein the instructions further cause the processor to:
compare an expected output of the destination register to a calculated output of the register that was injected with metastability; and
based on the comparison, determine that the expected output is not the same as the calculated output.

20. The non-transitory computer readable medium of claim 17, wherein the instructions further cause the processor to receive a user input including a command to apply the constraint to remove CDC pairs that do not affect the assertion.

* * * * *